United States Patent [19]
Jacobson et al.

[11] 3,951,677
[45] Apr. 20, 1976

[54] MULLITE FIBRILS

[76] Inventors: Howard Wayne Jacobson, 2009 Longcome Drive; George Leoutsacos Lewis, 1001 Graylyn Road, both of Graylyn Crest, Wilmington, Del. 19803

[22] Filed: Oct. 4, 1974

[21] Appl. No.: 512,138

Related U.S. Application Data

[63] Continuation-in-part of Ser. No. 69,931, Sept. 4, 1970, abandoned, and a continuation of Ser. No. 206,058, Dec. 8, 1971, abandoned.

[52] U.S. Cl. ............................. 106/288 B; 423/328; 423/329
[51] Int. Cl.² ...................... C01B 33/26; C08K 3/34
[58] Field of Search .......... 423/328, 330, 329, 111, 423/327; 106/288 B

[56] References Cited
UNITED STATES PATENTS

| | | | |
|---|---|---|---|
| 3,104,943 | 9/1963 | Berry | 423/327 |
| 3,366,445 | 1/1968 | Einstein et al. | 423/111 |
| 3,533,738 | 10/1970 | Rundell | 423/330 |
| 3,607,025 | 9/1971 | Jacobson | 423/328 |

FOREIGN PATENTS OR APPLICATIONS

| 644,471 | 10/1950 | United Kingdom | 423/328 |
|---|---|---|---|

*Primary Examiner*—Edward Stern

[57] ABSTRACT

Single crystal mullite fibrils having a diameter of about 3–100 nanometers, a length of about 0.05–2 microns and a length-to-diameter ratio of about 5–100:1 prepared by heating an intimate mixture of alumina and silica sources in the presence of an alkali metal salt flux to a temperature of about 750°–1200°C.

1 Claim, 3 Drawing Figures

1μ

1μ

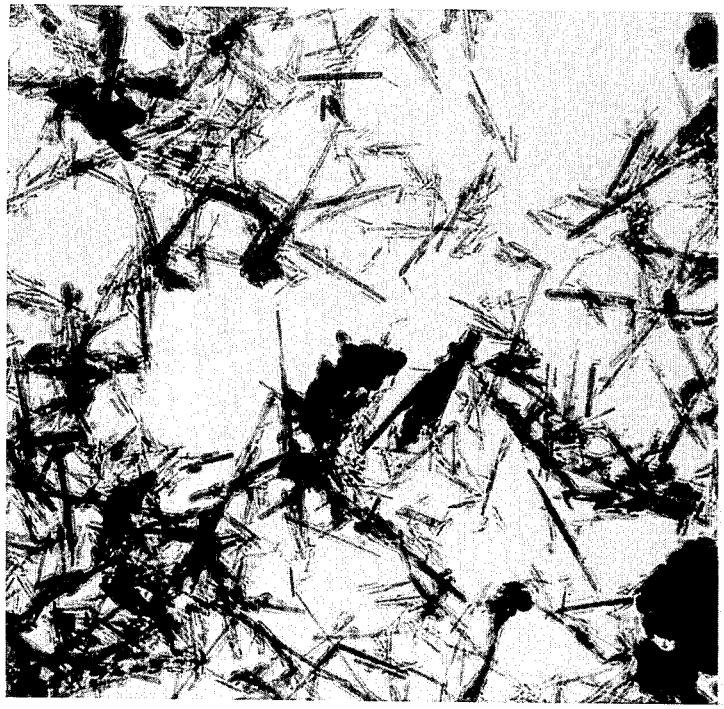
⊢──────⊣ FIG. 1
1μ
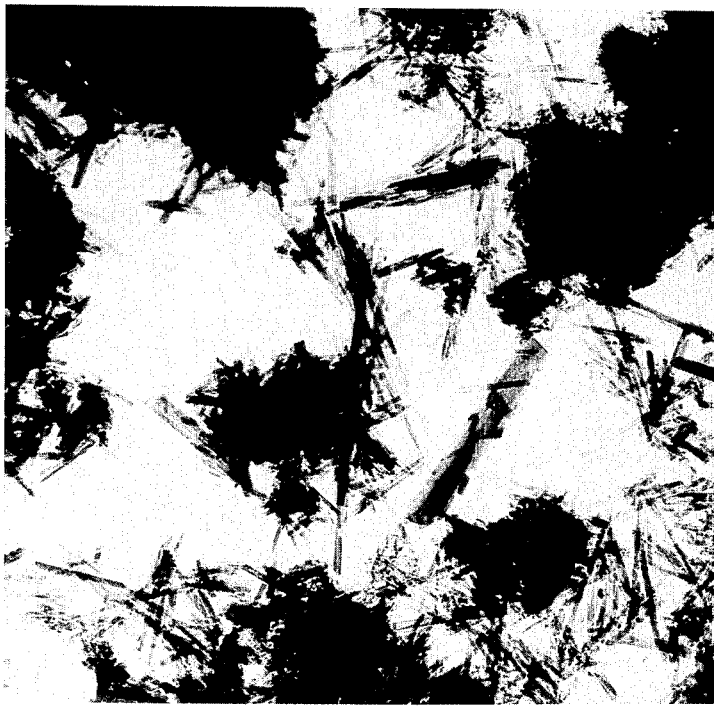
⊢──────⊣ FIG. 2
1μ

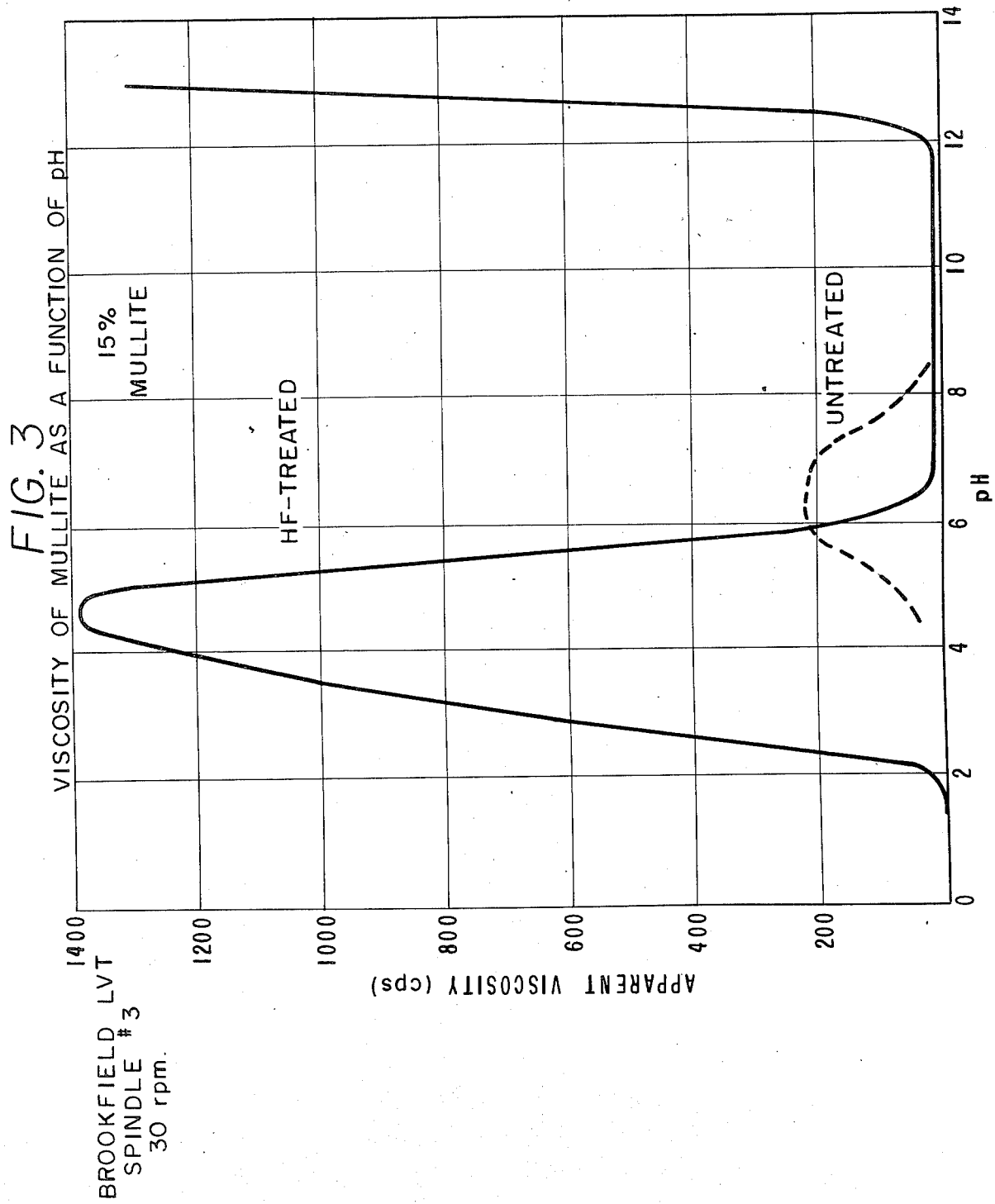

MULLITE FIBRILS

CROSS REFERENCE TO RELATED APPLICATIONS

This application is a continuation-in-part of our U.S. application Ser. No. 69,931 filed Sept. 4, 1970, now abandoned, and a continuation of Ser. No. 206,058, filed Dec. 8, 1971, now abandoned.

BACKGROUND OF THE INVENTION

Inorganic solids of colloidal size, less than 0.1 micrometer in diameter, are produced for a variety of commercial applications. Among these are: as pigment extenders and for rheological control in coatings; as fillers and reinforcers of elastomers and plastics; as catalysts and catalyst supports; for textile finishing; and as additives for preparation of glasses and ceramics. These products consist of particles which are of irregular spherical shape which readily agglomerate or aggregate to form large clumps that are difficult to redisperse in the appropriate end-use system. Thus, full advantage of their colloidal properties cannot be realized. Many are limited to low temperature applications because of their unstable composition or the sensitivity of their surface properties to high temperatures.

Colloidal particles in acicular form, however, offer advantages in their lesser tendency to aggregate and agglomerate and are therefore more useful because of their greater ease of dispersion to their ultimate particles. In addition, rheological control of colloidal dispersions is more easily effected by relatively smaller additions of acicular particles and, when the acicular particles are used as a filler, the product produced is significantly improved in strength properties due to the improved reinforcing provided by the acicular particles. Use as catalysts or catalyst supports is enhanced because of looser packing of acicular particles and applications as filters and insulating products are possible. The useful range of applications can be extended if the product consists of a phase stable at high temperatures.

The processes developed thus far to produce acicular particles of phases that are stable at high temperatures give products larger than colloidal size for application as insulation materials and for reinforcement of plastics, ceramics and metals, and the conditions required are generally too exacting for commercial application. Examples of these are the spinnable mullite fibers of Berry in U.S. Pat. No. 3,104,943, aluminum silicate fibers of Johnson, et al. in U.S. Pat. No. 3,321,271, Wainer in U.S. Pat. No. 3,023,115 and Jacobson in U.S. Pat. No. 3,607,025.

SUMMARY OF THE INVENTION

In accordance with the present invention. single crystal mullite fibrils characterized as having a diameter of about 3–100 nanometers, a length of about 0.05–2 microns and a length-to-diameter ratio of about 5–100:1 are prepared by:

a. intimately mixing aluminum sulfate, a material providing a source of silica and an alkali metal salt in such proportions that the molar ratio of aluminum to silicon, expressed as $Al_2O_3/SiO_2$, is between 2.6–6:2, and at least one alkali metal atom is present for each aluminum atom, b. heating the mixture to a temperature of about 750°–1200°C. until the evolution of $SO_3$ ceases, and c. washing and leaching the resultant product.

DETAILS OF THE INVENTION

Acicular, colloidal size particles of aluminum silicate having the mullite crystal structure can be prepared by calcining at 750°–1200°C. an intimate mixture of an aluminum salt, preferably aluminum sulfate, a source of silica, and sufficient alkali metal salts to give a good fluxing medium. The reaction is thought to proceed according to the following general equation:

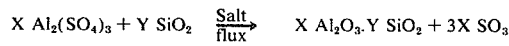

A mole ratio (X/Y) of 3/2 in the product aluminum silicate is considered to be true mullite, and experimental evidence indicates that this ratio is obtained in mullite portion of the product over a wide range of reactant compositions. Although a product that is predominantly mullite can be prepared with reactant mixtures ranging in compositions from 2.6–6:2 in $Al_2O/SiO_2$ molar ratios, it is preferred to maintain said ratio in the range of 2.8–3.4:2 or more preferably just slightly above the stoichiometric ratio of 3:2 to avoid the formation of granular particles of α-cristobalite which is encountered with excess silica. Large excesses of alumina in the reactant mixture lead to quantities of α-alumina platelets. The small amounts of either α-cristobalite or α-alumina obtained when the $Al_2O_3/SiO_2$ molar ratio of the resistant mixture is within the preferred range of 2.8–3.4:2 is not considered inimical to the product or process of this invention.

The products of this invention can be prepared by intimately grinding the dehydrated reactants, i.e. $Al_2(SO_4)_3$, $Na_2.SiO_3$ and $Na_2SO_4$, and calcining the mixture at temperatures above 750°C. for a sufficient length of time for the evolution of $SO_3$ to cease. However, it has been discovered that intimate mixing of the reactants can be effected with much greater ease by preparation of the reactants in the form of a gel prior to calcination. This procedure permits better control of the particle size of the final product by variations in calcination temperature and much better uniformity of product with respect to acicularity and the absence of unwanted phases.

In the preferred process the reactants, consisting of commercial hydrated aluminum sulfate and solid sodium metasilicate enneahydrate, along with fluxing agents such as a mixture of sodium sulfate and sodium chloride, are drymixed by rolling in a closed container for approximately ten minutes. The mixture is then transferred to a high speed mixer, along with a quantity of water, and mixed. After transferring the mixture to a suitable dish, a gel forms usually within 2–5 minutes, which is then dried at 200°C. for 2–6 hours. This latter step is not critical but reduces the amount of gas evolution during subsequent calcination. The dried brick is then calcined at 750°–1200°C. for from 1–2 hours, the conditions depending on the surface area of the product desired. After the calcined brick is cooled and crushed, it is leached with water to remove the bulk of soluble salt. The resulting lumps are then crushed and further leached with water lightly acidified with HCl, $H_2SO_4$, or other mineral acid until the product is substantially free of sulfate ion.

In a preferred embodiment of the invention, the mullite fibrils after leaching are further treated with a dilute aqueous solution containing 1 to 10% by weight of hydrogen fluoride to reduce the number of agglomerates. A light milling operation, i.e. using an air micronizer, may be utilized alternatively or in addition to also assist in breaking up agglomerates.

The source of alumina is one of the most critical elements in the process and aluminum sulfate is preferred because it gives the required uniformity of the final product and absence of undesirable phases. This is related to the fact that decomposition of aluminum sulfate occurs at a high enough temperature (750°–770°C.) that the formation of mullite is favored if silica is present. Aluminum hydroxide and other hydrated aluminas, aluminum nitrate, and organic salts of aluminum decompose at low temperatures and form unreactive alumina phases which persist in the final product. Aluminum phosphate and aluminum fluoride are exceptionally stable and unreactive. Aluminum halides, except for the fluoride, volatilize to an appreciable extent before temperatures are reached at which mullite formation occurs and are thus unattractive from an economic standpoint.

The hydrated aluminas, such as the α-trihydrate or the monohydrate (Boehmite) can be used if a sufficient quantity of alkali acid sulfate is added to the reaction mixture to convert these compounds to aluminum sulfate. This may occur partly when the gel is prepared and be completed at low temperatures during the early stages of calcination. This variation might also be applied to alumina salts which would form a volatile compound by the reaction with an acid sulfate. Such a salt is aluminum chloride which would form hydrogen chloride on reaction with an acid sulfate.

Favorable results have been obtained with the crystalline alkali silicates, a solution of alkali silicates (water glass), ground quartz, feldspar, asbestos, and commercial silica extenders to serve as the source of silica. It will be understood that the source material must be capable of yielding silica at the calcining temperature of 750°–1200°C. Quartz sand, diatomaceous earth, clay and other inexpensive, naturally occurring siliceous materials may be used but are less desirable as generally it is advantageous to have starting materials substantially free from color producing impurities, i.e. iron, nickel, vanadium. From the standpoint of purity and ease of gel formation, which is the preferred method of obtaining intimate mixing of the reactants and fluxing salts, the alkali silicates are the preferred sources of silica.

It had been discovered that the presence of salt, preferably that of an alkali metal, in excess of one atom of alkali metal for each atom of aluminum in the reaction mixture, and preferably in excess of five atoms of alkali metal to one atom of aluminum, is necessary in order to obtain good yields of a uniform quality product. This quantity of salt is thought to function as a fluid reaction medium for mass transfer and proper nucleation of silica and alumina components for fibril growth during the calcination. Quantities of alkali metal salt sufficient to give a 10:1 atomic ratio of alkali metal to aluminum have been successfully used to produce good quality product and higher ratios may be used, although the upper limits may be economically limited by the quantities of salt to be removed from the product after reaction.

Sodium sulfate, or mixtures of sodium sulfate and sodium chloride are preferred because of their low cost, relatively low melting points and solubilities in water. Mixtures of sodium sulfate and sodium chloride are mot preferred because of better product acicularity and uniformity obtained therefrom and because the calcined brick is more friable and easier to leach. The equivalent salts of potassium or other alkali metals can be used although they are economically less desirable.

Although the products of this invention can be produced by comminution and intimate mixing of the dried reaction ingredients, mixing and, as a consequence, uniformity of product is greatly enhanced by first processing the reactants to form a gel. Water is the preferred medium although other liquids, such as methanol, have been used successfully. Although the structures of the gels are unknown, the reactants are apparently distributed throughout the gel mass in units of colloidal dimension or smaller, thus allowing the reaction to proceed rapidly to the formation of the desired mullite product. It also minimizes the formation of unwanted phases of alumina or silica which may occur in systems such as mixed particles where large local concentrations of specific reactants may occur.

The conditions for gel formation are variable, depending on the ingredients used. Where the reactants are aluminum sulfate and the alkali silicates, gel formation occurs readily and is probably an intimate mixture of partially hydrolyzed aluminum sulfate and hydrous silica. Where a particulate, insoluble, source of silica is used, conditions must be readjusted and the gel must be substantially a hydrous alumina. These differences in formulation will be illustrated in the examples cited below.

Electron micrographic examination shows the products of this invention to consist predominantly of acicular particles, either fiber or ribbon shaped, ranging from 3 to 100 nanometers in diameter, and from 0.05 to 2 micrometers in length, depending on the proportions of reactants and the processing temperatures. Aspect ratios of the particles, defined as the ratio of the longest dimension to the average cross-sectional dimension, range from 5:1 to 100:1 and are dependent on processing conditions. The mullite fibrils, being colloidal in size, are non-spinnable, and hence not at all comparable to the fibers of Berry U.S. Pat. No. 3,104,943.

Considerable numbers of the particles of mullite fibrils may occur as ribbons. Although it is difficult to determine, the ratio of the large-to-small cross-sectional dimension is estimated to reach 10:1. Under conditions of processing outlined herein, only a very small proportion of particles can be identified as nonacicular, i.e. irregular spheres or platelets. X-ray examination of the products of this invention show that diffraction peaks at angles characteristic of the mullite crystal structure exist over a composition range of 2.6–6:2 mole ratios of alumina to silica in the reactants. Experimentals evidence indicates that the fibrils and ribbons are monocrystalline, i.e. single crystals.

The products of this invention exhibit surface areas, as determined by nitrogen adsorption, ranging from 30 $M^2/gm$ to 350 $M^2/gm$, the value depending largely on processing temperature and time at temperature. Since surface area is a sensitive indication of relative particle size and because acicular particles are difficult to characterize in terms of actual particle size distributions, surface areas will be used in the examples hereinafter cited to characterize the product as it is affected by processing variables.

Particle sizes of the product, although affected by the ratio of alumina to silica in the reaction products and the amount of salt flux, can be varied by changing the reaction temperature. Surface area decreases (particle size increases) with increasing reaction temperature. For the same composition of reactants when using the gel process to obtain intimate mixing, heating for one hour at temperature produces fibrils having a surface area of 300 $M^2/gm$ at 800°C. to a product with 45 $M^2/gm$ at 1200°C. The decrease in surface area is roughly logarithmic, with the greatest decrease occurring between 800° and 900°C. Morphology is somewhat affected by temperatures with the proportion of ribbon-type fibrils generally greater at the higher temperatures. Yield of fibrils is nearly quantitative.

The following examples illustrate this invention.

Examples 1, 2 and 3 illustrate the preparation of mullite fibrils by calcining mixtures of the reactants in dry powder form and the effects of variations in $Al_2O_3/SiO_2$ ratios and the quantity of salt flux.

EXAMPLE 1

Solid sodium metasilicate enneahydrate (2.84 gm) and sodium sulfate (12.8 gm) are mixed by mortar and pestle and heated a 600°C. for 30 minutes to dehydrate the mixture. Commercial hydrated aluminum sulfate (13.33 gm) is dehydrated by heating at 600°C. and then ground with the dried sodium silicate and sodium sulfate using a mortar and pestle. This mixture is then heated in a platinum dish at 900°C. for 2 hours. The product is leached free of sodium sulfate and dried. Electron micrographs show the product to be substantially all in fibril form and about 10 nanometers in average diameter. X-ray analysis shows mullite to be the predominant phase with some cristobalite present. Surface area by nitrogen absorption is 85 $M^2/gm$. $Al_2O_3/SiO_2$ mole ratio in the reactants is 4:2.

EXAMPLE 2

The process of Example 1 except that 3.86 gm. of sodium metasilicate enneahydrate is used giving an $Al_2O_3/SiO_2$ mole ratio of 2.94:2. The product is predominantly fibrils of mullite, although some unidentified nonacicular material is present. Surface area by nitrogen absorption is 64 $M^2/gm$.

EXAMPLE 3

The process of Example 2 except that the amount of sodium sulfate is doubled to 25.8 gm. The product is substantially acicular mullite with a surface area of 68 $M^2/gm$. Some nonacicular material is present and cristobalite is detected in the X-ray diffraction pattern.

Examples 4–8 illustrate the advantages of using the gel technique in allowing better control of particle size (surface area) and reducing the formation of unwanted, nonacicular phases such as cristobalite and corundum, in addition to the marked influence of temperature on the particle size of the product.

EXAMPLE 4

The following ingredients are mixed by rolling in a gallon jar for 10 minutes:
- 1360 g of $Al_2(SO_4)_3 \cdot 18H_2O$
- 360 g of $Na_2SiO_3 \cdot 9H_2O$
- 650 g NaCl
- 450 g of $Na_2SO_4$.

These ingredients are added to a large blender with 300 cc. $H_2O$, mixed at medium high speed for five minutes and poured into a Pyrex dish. After a few minutes a gel forms which is dried at 200°C. for 6 hours. The dried gel in the form of a brick is fired at 800°C. for 1 hour. After the brick cools, it is broken into lumps and leached successively with water and acidified water until no sulfate ion is detected. The $Al_2O_3/SiO_2$ mole ratio of the reactants is 3.2:2. Electron micrographs show acicular particles which are rather short, having an aspect ratio ranging from 5–20 and no evidence of nonacicular material. X-ray analysis shows only mullite diffraction peaks. Surface area by nitrogen absorption is 300 $M^2/gm$.

EXAMPLE 5

The process of Example 4 except that the dried brick from the gel is fired at 900°C. Electron micrographs show a considerable increase in acicularity over the product of Example 4. Only mullite is detected in the X-ray analysis. Surface area of the product is 126/$M^2gm$.

EXAMPLE 6

The process of Example 4 except that the dried gel brick is fired at 1050°C. for 1 hour. Examination by electron micrograph and X-ray diffraction show only the presence of mullite fibrils. Some of the fibrils show ribbon-type morphology. Aspect ratios range from 10:1 to 50:1. Surface area of the product is 59 $M^2/gm$.

EXAMPLE 7

The process of Example 4 except that the dried gel is fired at 1100°C. for 1 hour. The product is similar to that of Example 6. Surface area is 56 $M^2/gm$.

EXAMPLE 8

The process of Example 4 except that dried gel is fired at 1200°C. The product is somewhat more acicular than that of Example 7. Only the mullite diffraction pattern is observed by X-ray analysis. Electron micrographs show the presence of a nonacicular phase which is not identifiable. Surface area of the product is 45 $M^2/gm$.

EXAMPLE 9

This example illustrates the use of a source of silica other than an alkali silicate for the preparation of mullite fibrils by the method of this invention.

A gel is prepared by blending 1360 gm of $Al_2(SO_4)_3 \cdot 18H_2O$, 680 gm of NaCl, 450 gm of $Na_2SO_4$, 140 gm of a finely ground potassium feldspar with 1300 cc. of water. The gel, after drying at 200°C. for 6 hours is fired at 900°C. for 1 hour. After recovering the product by leaching with water and dilute acid, it is identified as predominantly mullite fibrils by electron microscope and X-ray diffraction. The fibrils are mostly of the ribbon-type in morphology. Surface area of the product is 90 $M^2/gm$.

EXAMPLE 10

This example illustrates the use of methanol instead of water for gel preparation. A gel is prepared by blending 450 gm of $Al_2(SO_4)_3 \cdot 18H_2O$, 110 gm of $Na_2SiO_3 \cdot 9H_2O$, 225 gm of NaCl and 135 gm $Na_2SO_4$ with 500 cc. of methyl alcohol. After allowing the gel to set, it is dried for 4 hours at 110°C. in a vacuum oven, and is fired for 1 hour at 900°C. The product recovered by water leaching the fired mixture consists of mullite fibrils with a surface area of 108 $M^2/gm$.

EXAMPLE 11

The general procedure of Example 5 is followed except that in this case the fired brick, after leaching to remove the final traces of sulfate ion is further treated with hydrofluoric acid.

Thus a 100 gm. sample of mullite fibrils, after micronizing to remove large aggregates, was added to 200 cc. of an aqueous 2% by weight HF solution in a polyethylene vessel equipped with a polyethylene stirrer and the dispersion mixed for 4 hours. Thereafter the sample was filtered and washed with distilled water to a pH of 5, dried and micronized.

The HF treated mullite fibrils (FIG. 1) are examined under a microscope and observed to contain many fewer aggregates than the material before treatment (FIG. 2). The dimensions of individual fibrils are essentially unchanged but the surface area has substantially increased. Thus a surface area measurement of 95 $M^2$/gm. was recorded for the material before the HF treatment whereas the final product had a value of 178 $M^2$/gm.

FIG. 3 shows the graphic results of viscosity measurements, with varying pH, of 15% by weight aqueous dispersions of the samples. The measurements are made using a Brookfield LVT viscometer, No. 3 spindle, 30 rpm.

The unique rheological properties of the mullite fibrils, particularly those treated with HF, are apparent from FIG. 3.

EXAMPLE 12

HF-treated mullite fibrils produced in accordance with the general procedure of Example 11 are tested for their ability to thicken a polar solvent, in particular methyl ethyl ketone which is widely used in adhesive formulations.

As a "Control" a sample of commercial fumed silica, widely promoted for its thickening and thixotropic properties, is similarly tested. The silica material has an average particle size of 0.012 microns and a surface area of 200 ±25 $M^2$/gm.

In the test, a portion of each particulate material is dispersed in methyl ethyl ketone and the apparent viscosity measured using a Brookfield LVT viscometer, spindle No. 2 at 30 rpm.

| Thickener | % Solids | Apparent Viscosity |
|---|---|---|
| Mullite fibrils | 6.5% | 115 cps |
| Control (silica) | 8.6% | 20 cps |
| Mixture { mullite | 4.3% | 650 cps |
| silica | 1.2% | |

The superiority of the mullite fibrils as a thickener for the polar solvent methyl ethyl ketone is apparent. In addition it can be seen that a combination of mullite fibrils and silica provides an outstanding synergistic effect. From other data which indicates that the mullite fibrils thicken non-polar solvents to a lesser extent than does the silica, it is concluded that entirely different thickening mechanisms are involved.

What is claimed is:

1. A particulate aluminum silicate composition having a surface area from 30 $M^2$/gm to 350 $M^2$/gm as determined by nitrogen adsorption and having an $Al_2O_3$:$SiO_2$ molar ratio of 2.8:2 to 3.4:2 consisting essentially of a major amount of colloidal, nonspinnable, monocrystalline mullite fibrils and a minor amount of alumina and silica, said mullite fibrils having an $Al_2O_3$:$SiO_2$ molar ratio of 3:2, a diameter of 3–100 nanometers, a length of 0.05–2.0 microns and a length-to-diameter ratio of from 5:1 to 100:1.

* * * * *